United States Patent
Kim et al.

(10) Patent No.: US 11,659,674 B2
(45) Date of Patent: May 23, 2023

(54) DISPLAY DEVICE

(71) Applicant: LG DISPLAY CO., LTD., Seoul (KR)

(72) Inventors: HanSeok Kim, Paju-si (KR); Hyeongkyu Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/555,034

(22) Filed: Dec. 17, 2021

(65) Prior Publication Data

US 2022/0210938 A1 Jun. 30, 2022

(30) Foreign Application Priority Data

Dec. 30, 2020 (KR) .......................... 10-2020-0186997

(51) Int. Cl.
| | | |
|---|---|---|
| H05K 5/02 | (2006.01) | |
| H01H 36/00 | (2006.01) | |
| H05K 5/00 | (2006.01) | |
| H01L 25/075 | (2006.01) | |
| H01L 27/32 | (2006.01) | |

(52) U.S. Cl.
CPC ......... *H05K 5/0247* (2013.01); *H01H 36/008* (2013.01); *H05K 5/0017* (2013.01); *H01H 2221/044* (2013.01); *H01L 25/0753* (2013.01); *H01L 27/3293* (2013.01)

(58) Field of Classification Search
None
See application file for complete search history.

(56) References Cited

U.S. PATENT DOCUMENTS

| | | | | |
|---|---|---|---|---|
| 9,219,322 | B1* | 12/2015 | Wei | H01R 12/7076 |
| 9,845,816 | B2* | 12/2017 | Brashnyk | H01F 7/0252 |
| 10,729,020 | B2* | 7/2020 | Chang | H05K 5/0021 |
| 10,816,022 | B2* | 10/2020 | Kim | H05K 5/0021 |
| 11,011,084 | B1* | 5/2021 | Hemphill | H01R 13/6205 |
| 2009/0065918 | A1* | 3/2009 | Murphy | H01R 12/7076 257/686 |
| 2011/0001025 | A1* | 1/2011 | Fiedler | H01F 7/0242 248/206.5 |
| 2015/0362160 | A1* | 12/2015 | Andreasen | G09F 9/33 362/97.1 |
| 2016/0011844 | A1* | 1/2016 | Patterson | F21V 21/088 29/434 |
| 2016/0076744 | A1* | 3/2016 | Hirano | H01R 12/7076 362/382 |
| 2016/0210886 | A1* | 7/2016 | Brashnyk | F16M 11/041 |
| 2016/0294095 | A1* | 10/2016 | Kim | H01R 12/7076 |

(Continued)

FOREIGN PATENT DOCUMENTS

KR 10-2010-0104009 A 9/2010

*Primary Examiner* — Xanthia C Cunningham
(74) *Attorney, Agent, or Firm* — Polsinelli PC

(57) ABSTRACT

A display device includes a display panel, a frame disposed on a rear surface of the display panel, a plurality of panel magnets disposed in the frame, a plurality of panel ferromagnetic substances disposed on both side surfaces of each of the plurality of magnets, and a connecting module disposed on the rear surface of the display panel and having a connecting plate for supplying power to the display panel, in which the connecting plate is configured to protrude outside the frame or be positioned more inward than the rear surface of the frame depending on the detachment from the panel ferromagnetic substances of the connecting module.

20 Claims, 11 Drawing Sheets

(56) References Cited

U.S. PATENT DOCUMENTS

| | | | | |
|---|---|---|---|---|
| 2016/0365657 A1* | 12/2016 | Ueyama | ............... | H05K 7/1069 |
| 2017/0006727 A1* | 1/2017 | Ryu | .................... | H01L 25/0753 |
| 2017/0064850 A1* | 3/2017 | Blase | ....................... | H05K 5/03 |
| 2017/0127539 A1* | 5/2017 | Drabant | ................ | G09F 9/3026 |
| 2017/0162965 A1* | 6/2017 | Hallack | ............... | H01R 12/707 |
| 2017/0202098 A1* | 7/2017 | Gou | .................... | H05K 5/0204 |
| 2017/0220310 A1* | 8/2017 | Hochman | .......... | H01R 13/6205 |
| 2018/0081408 A1* | 3/2018 | Lilje | .................... | H01R 13/521 |
| 2019/0037712 A1* | 1/2019 | Kim | .................... | H05K 5/0204 |
| 2019/0103688 A1* | 4/2019 | Pandya | ................. | G04G 21/08 |
| 2019/0191574 A1* | 6/2019 | Kim | .................... | F16B 21/086 |
| 2019/0327843 A1* | 10/2019 | Chang | ................ | G02F 1/13336 |
| 2020/0064677 A1* | 2/2020 | Yoon | .................... | G09F 9/3026 |
| 2020/0080683 A1* | 3/2020 | Flowers | ............... | F16M 11/041 |
| 2020/0194539 A1* | 6/2020 | Kim | .................... | H01L 51/5237 |
| 2020/0388548 A1* | 12/2020 | Blackburn | ........... | G02B 6/4278 |

\* cited by examiner

DISPLAY DEVICE

CROSS-REFERENCE TO RELATED APPLICATION

This application claims the priority of Korean Patent Application No. 10-2020-0186997 filed on Dec. 30, 2020, which is hereby incorporated by reference in its entirety.

BACKGROUND

Field of the Disclosure

The present disclosure relates to a display device, and more particularly, to a display device that provides easy connection with a power connector during a tiling process for a large display area.

Description of the Background

In display devices which are used for monitors of computers, TVs, mobile phones, or the like, there are an organic light emitting display (OLED), and the like that self-emit light, and a liquid crystal display (LCD), and the like that require a separate light source.

The display devices are diversified in application ranges up to personal mobile devices as well as monitors of computers and TVs, and research on display devices with reduced volume and weight as well as a wide display area has been conducted.

Meanwhile, recently, a plurality of display devices are connected to each other to use a tiling display device with a large display area as a billboard and the like.

SUMMARY

Accordingly, the present disclosure is to provide a display device capable of controlling the connecting of a rear surface of the display device on a front surface of the display device without using complicated lines to tile the display device.

The present disclosure is also to provide a display device with minimized catching or short-circuit occurrence in a process of connecting complicated lines when tiling the display device.

The present disclosure is not limited to the above-mentioned and the features not mentioned above, can be clearly understood by those skilled in the art from the following descriptions.

According to an aspect of the present disclosure, the display device includes: a display panel, a frame disposed on a rear surface of the display panel, a plurality of panel magnets disposed in the frame, a plurality of panel ferromagnetic substances disposed on both side surfaces of each of the plurality of magnets, and a connecting module disposed on the rear surface of the display panel and having a connecting plate for supplying power to the display panel, in which the connecting plate is configured to protrude outside the frame or be positioned more inward than the rear surface of the frame depending on the detachment from the panel ferromagnetic substances of the connecting module.

According to another aspect of the present disclosure, the display device includes: a display panel, a connecting module disposed on a rear surface of the display panel and having a connecting plate for supplying power to the display panel, and a frame which supports the display panel on the rear surface of the display panel and are disposed with a plurality of panel magnets and a plurality of panel ferromagnetic substances, in which the connecting plate is configured to be protruded outside the frame or positioned more inward than the rear surface of the frame depending on the detachment from the panel ferromagnetic substances of the connecting module.

Other detailed matters of the exemplary aspects are included in the detailed description and the drawings.

According to the present disclosure, it is possible to tile display devices by a convenient method of controlling the connecting of the rear surface of the display device on the front surface of the display device.

According to the present disclosure, it is possible to improve the catching or short-circuit occurrence due to a complicatedly wired cable on the rear surface of the display device when tiling the display devices by using a wireless connecting module.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
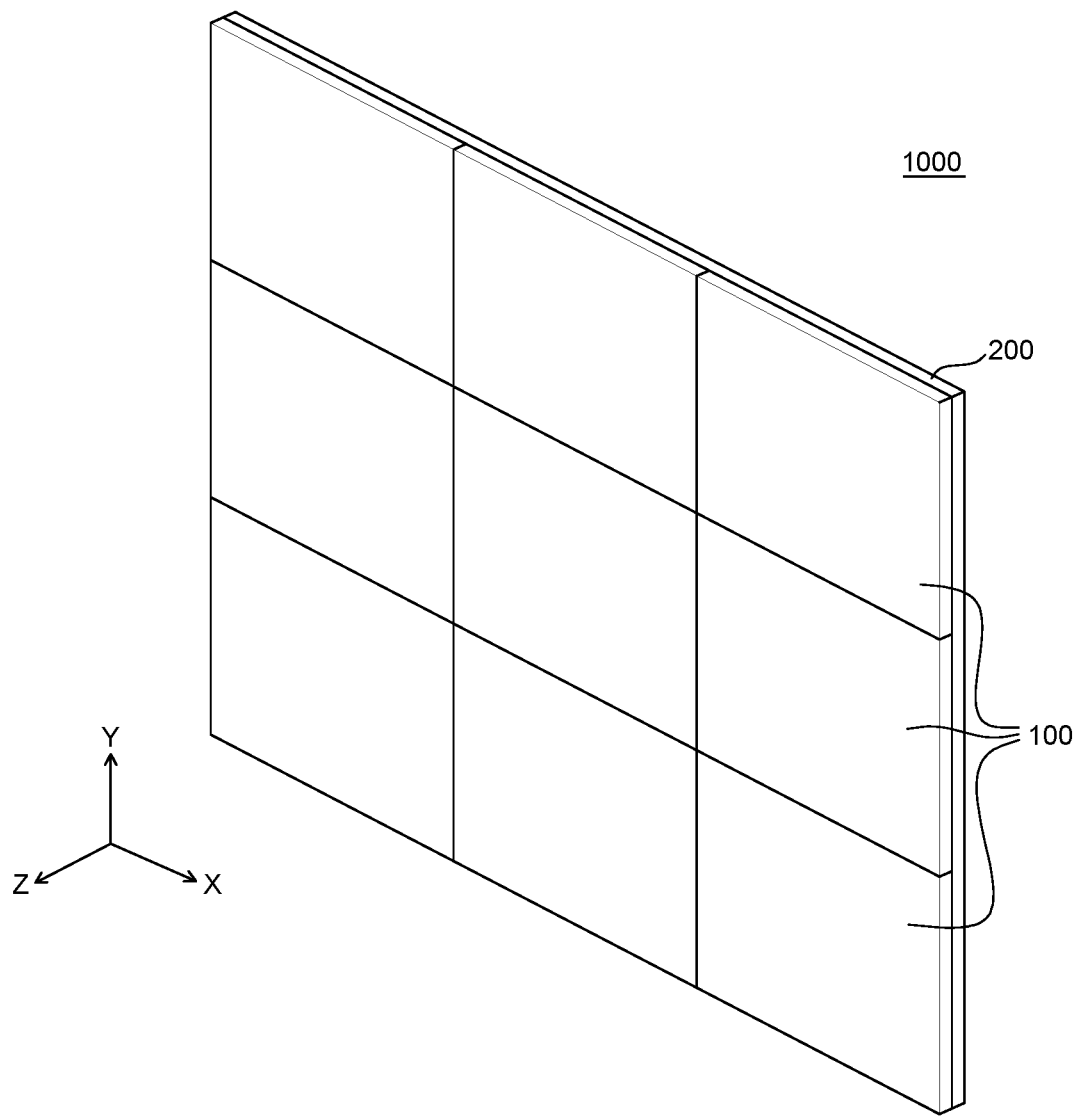
FIG. 1 is a perspective view of a tiling display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including" "having" and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, still another layer or still another element may be interposed directly on the another element or layer or therebetween.

Although the terms "first", "second", and the like are used for describing various components, these components are not confined by these terms. These terms are merely used for distinguishing one component from other components. Therefore, a first component to be mentioned below may be a second component in a technical concept of the present disclosure.

Like reference numerals generally denote like elements throughout the specification.

A size and a thickness of each component illustrated in the drawings are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a stretchable or expandable display device according to exemplary aspects of the present disclosure will be described in detail with reference to accompanying drawings.

FIG. 1 is a perspective view of a tiling display device according to an exemplary aspect of the present disclosure. Referring to FIG. 1, a tiling display device 1000 according to an exemplary aspect of the present disclosure is achieved by connecting a plurality of display devices 100 according to an exemplary aspect of the present disclosure.

Referring to FIG. 1, the tiling display device 1000 according to an exemplary aspect of the present disclosure includes a plurality of display devices 100 and a wall surface portion 200. The tiling display device 1000 may be implemented by disposing the plurality of display devices 100 to enlarge a display area in which an image is displayed.

Each of the plurality of display devices 100 is attached to the wall surface portion 200 to be arranged like a single display device. For example, the plurality of display devices 100 are attached to the wall surface portion 200 in a tile form to implement the tiling display device 1000. In this case, although not illustrated, various lines, cables, and the like electrically connecting each of the plurality of display devices 100 may be disposed on the wall surface portion 200, and the plurality of display devices 100 may be driven like one display device.

Meanwhile, since the tiling display device 1000 has an extra-large size, it is difficult to convey the tiling display device 1000 to an installation place while connecting the plurality of display devices 100. Thus, after conveying the plurality of display devices 100 to the installation place, the plurality of display devices 100 may be assembled to the tiling display device 1000 in the installation place.

In addition, when the plurality of display devices 100 are attached to the wall surface portion 200, the plurality of display devices 100 may be attached to the wall surface portion 200 as close as possible while intervals between the plurality of display devices 100 are constant and minimized so that the plurality of display devices 100 looks like one display device 100. That is, the plurality of display devices 100 are precisely aligned to be attached to the wall surface portion 200, thereby a boundary area in which an image is not displayed may be minimized.

Figure 2:
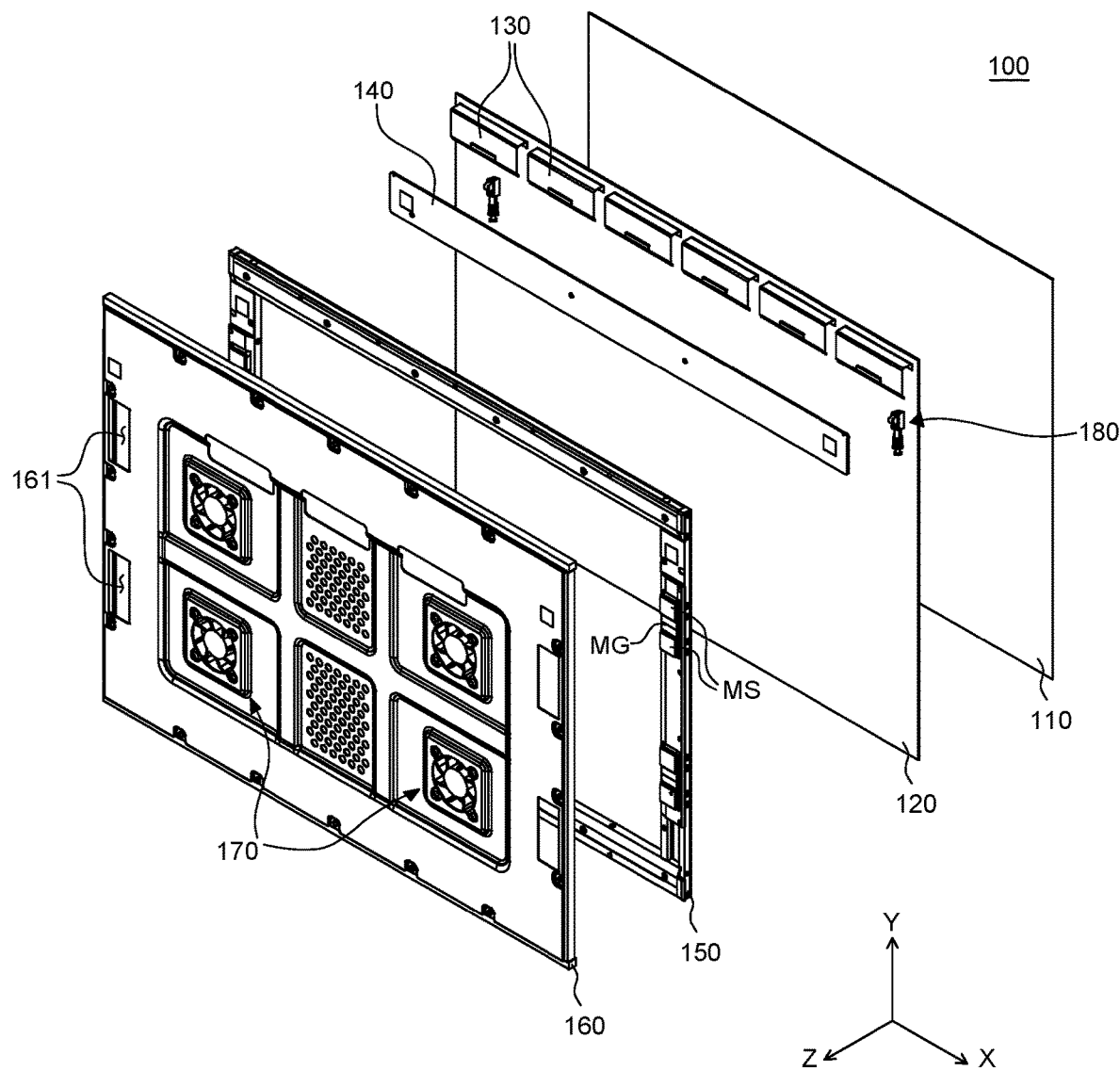
FIG. 2 is an exploded perspective view of the display device according to an exemplary aspect of the present disclosure.
Figure 3:
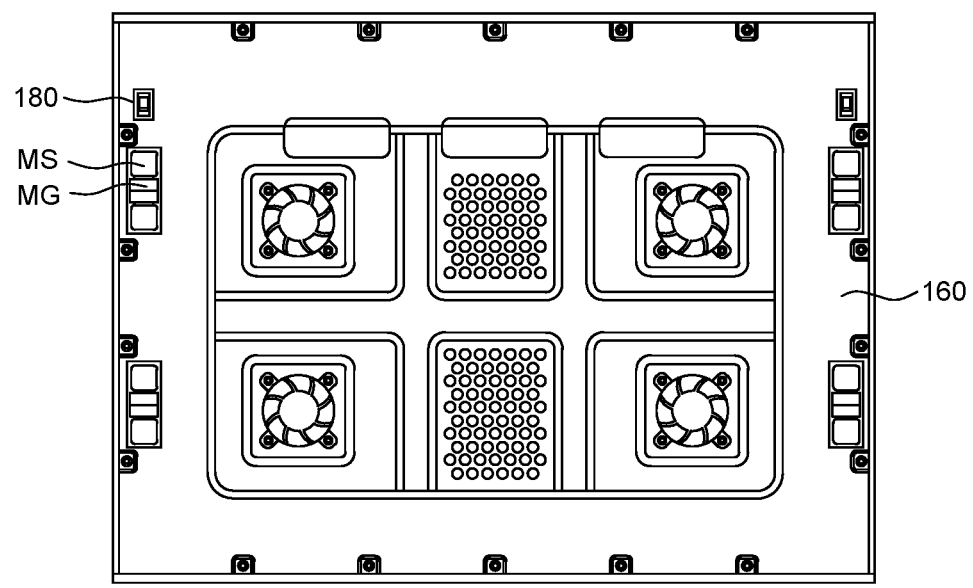
FIG. 3 is a rear view of the display device according to an exemplary aspect of the present disclosure.
Figure 4:
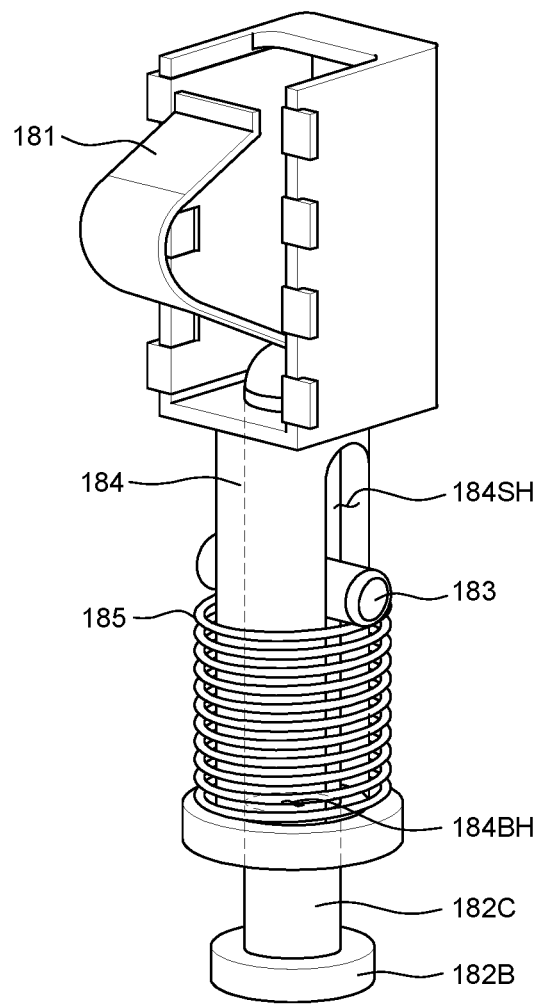
FIG. 4 is a perspective view of a connecting module of the display device according to an exemplary aspect of the present disclosure.
Figure 5:
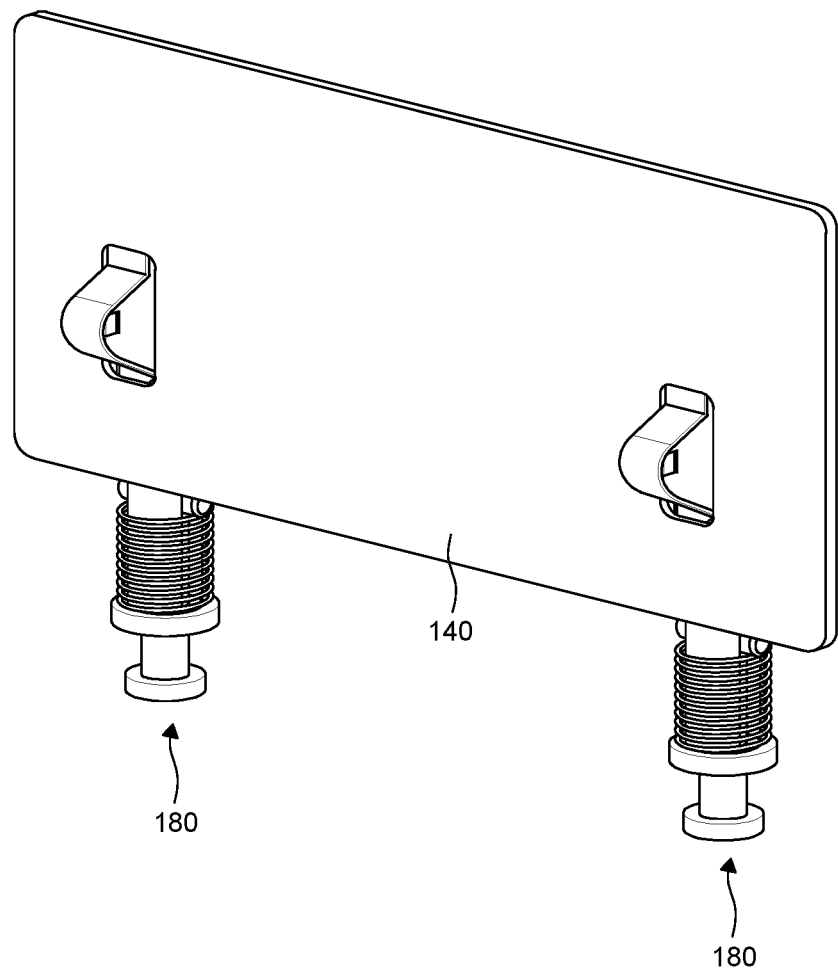
FIG. 5 is a schematic perspective view of a connecting module and a printed circuit board of the display device according to an exemplary aspect of the present disclosure.

FIG. 2 is an exploded perspective view of the display device according to an exemplary aspect of the present disclosure. FIG. 3 is a rear view of the display device according to an exemplary aspect of the present disclosure. FIG. 4 is a perspective view of a connecting module of the display device according to an exemplary aspect of the present disclosure. FIG. 5 is a schematic perspective view of a connecting module and a printed circuit board of the display device according to an exemplary aspect of the present disclosure. In FIGS. 2 and 3, only one display device 100 of the plurality of display devices 100 of the tiling display device 1000 has been illustrated for convenience of description.

Each of the plurality of display devices 100 is a configuration that displays an image, and is a basic unit constituting the tiling display device 1000. Referring to FIG. 2, the display device 100 includes a protective plate 110, a display panel 120, a plurality of flexible films 130, a printed circuit board 140, a frame 150, a cover shield 160, a heat dissipation fan 170, a connecting module 180, a plurality of panel magnets MG, and a plurality of panel ferromagnetic substances MS.

First, the display panel 120 is a configuration for displaying an image to the user. The display panel 120 may be disposed with, for example, a display element, and circuits, lines, components, and the like for driving the display element. The display element may be defined differently depending on a type of display panel 120, and for example, when the display panel 120 is an organic light emitting display panel, the display element may be an organic light emitting element including an anode, an organic emission layer and a cathode. For example, if the display panel 120 is an inorganic light emitting display panel, the display element may be a light emitting diode (LED) or a micro LED including an n-type semiconductor layer, a p-type semiconductor layer, and an emission layer. However, it is not limited thereto, and the display element of the display panel 120 may be variously configured.

A plurality of flexible films 130 are bonded to the rear surface of the display panel 120. The flexible film 130 may be electrically connected to the display panel 120 as a film for supplying a signal to a display element and a circuit unit by disposing various components in a base film having a ductility. The plurality of flexible films 130 may supply a power supply voltage, a data voltage, and the like to the display panel 120. On the other hand, in FIG. 2, it has been illustrated that the plurality of flexible films 130 are 6 flexible films and are bonded to a long side of the display panel 120, but the number and arrangement of the plurality of flexible film 130 may be variously changed according to a design, and it is not limited thereto.

Driving ICs such as a gate driver IC and a data driver IC may be disposed on the plurality of flexible films 130. The driving IC is a component that processes data for displaying the image and a driving signal for processing the data. The driving IC may be disposed by a method such as a chip on glass COG, a chip on film COF, a tape carrier package TCP, in accordance with a mounting method. However, for convenience of description, it has been described as the chip on film method in which the driving ICs are mounted on the plurality of flexible films 130 but is not limited thereto.

The printed circuit board 140 is electrically connected to the plurality of flexible films 130. The printed circuit board 140 is a component that supplies a signal to the driving IC. The printed circuit board 140 may be disposed with various components for supplying various signals such as a driving signal, and a data signal to the driving IC. On the other hand, in FIG. 2, one printed circuit board 140 has been illustrated, but the number of printed circuit boards 140 may be variously changed according to a design and is not limited thereto.

The frame 150 is disposed on the rear surface of the display panel 120. The frame 150 may support and protect the display panel 120 on the rear surface of the display panel 120. The frame 150 may be made of a material having rigidity, for example, may be made of a metal material such as aluminum (Al), copper (Cu), zinc (Zn), silver (Ag), gold (Au), iron (Fe), steel use stainless (SUS) or Invar, or a material such as plastic.

The frame 150 may have a shape corresponding to an edge of the display panel 120. For example, the frame 150 may be formed in a frame shape corresponding to the edge of the display panel 120. The frame 150 may support the edge of the display panel 120 to allow the display panel 120 to be maintained in a flat state. However, the frame 150 may also be formed in the same shape as the planar shape of the display panel 120 instead of the frame shape, and the shape of the frame 150 is not limited thereto so long as the frame 150 may support the display panel 120.

A plurality of panel magnets MG are disposed on the rear surface of the display panel 120. The plurality of panel magnets MG may be fixed to a rear surface of the frame 150 on the rear surface of the display panel 120. The plurality of panel magnets MG are components which are disposed on the rear surfaces of the display panel 120 and the frame 150 to attach the display device 100 to the wall surface portion 200. For example, the plurality of panel magnets MG may be bar-shaped magnets consisting of one N pole and one S pole but are not limited thereto. In this case, the plurality of panel magnets MG may be fixed to the frame 150 using an adhesive member or a separate fastening member but is not limited thereto.

A plurality of panel ferromagnetic substances MS are disposed on the rear surface of the display panel 120. The plurality of panel ferromagnetic substances MS may be fixed to the rear surface of the frame 150 on the rear surface of the display panel 120. The plurality of panel ferromagnetic substances MS may be disposed on both side surfaces of each of the plurality of panel magnets MG. Each of the plurality of panel magnets MG may be disposed between the plurality of panel ferromagnetic substances MS. For example, one panel ferromagnetic substance MS of the plurality of panel ferromagnetic substances MS may be in contact with an N pole of the panel magnet MG and the other panel ferromagnetic substance MS may be in contact with an S pole of the panel magnet MG. One panel magnet MG may be disposed between the two panel ferromagnetic substances MS. The plurality of panel ferromagnetic substances MS may be made of a ferromagnetic material, for example, steel, but are not limited thereto.

The display device 100 may be attached to the wall surface portion 200 by using the plurality of panel magnets MG and the plurality of panel ferromagnetic substances MS. For example, when the display device 100 is in contact with the wall surface portion 200, magnetic field lines are induced among the wall surface portion 200, the panel magnets MG, and the panel ferromagnetic substances MS so that the display device 100 may be fixed to the wall surface portion 200. In this case, the plurality of panel ferromagnetic substances MS may be omitted, and the display panel 100 may be attached to the wall surface portion 200 by only the plurality of panel magnets MG. Meanwhile, the method of attaching the display device 100 to the wall surface portion 200 by using the plurality of panel magnets MG and the plurality of panel ferromagnetic substances MS is exemplified. However, other fastening members may also be disposed instead of the plurality of panel magnets MG and the plurality of panel ferromagnetic substances MS, and it is not limited thereto.

Referring to FIGS. 2 and 3 together, a cover shield 160 is disposed on the rear surface of the frame 150. The cover shield 160 may cover the plurality of flexible films 130 and the printed circuit board 140 on the rear surface of the frame 150. Specifically, the plurality of flexible films 130 are bonded to the rear surface of the display panel 120. In addition, the frame 150 may be combined with the display panel 120 on the rear surface of the display panel 120. In this case, the plurality of flexible films 130 and the printed circuit board 140 may be not disposed between the display panel 120 and the frame 150 but may be disposed to cover the frame 150. The plurality of flexible films 130 may be easily bent as a film in which various components are disposed on a base film having a ductility as described above. Accordingly, the plurality of flexible films 130 are bent to cover the frame 150, so that the plurality of flexible films 130 and the printed circuit board 140 may be disposed on the display panel 120 and the frame 150.

The cover shield 160 is disposed to cover the display panel 120, the plurality of flexible films 130, the printed circuit board 140, and the frame 150. Specifically, since the frame 150 does not cover the plurality of flexible films 130 and the printed circuit board 140, it may be difficult to protect the plurality of flexible films 130 and the printed circuit board 140 from an external impact. Therefore, the cover shield 160 may be disposed on the rear surface of the frame 150 to protect the plurality of flexible film 130 and the printed circuit board 140. The cover shield 160 is disposed to cover the display panel 120, the plurality of flexible film 130, the printed circuit board 140, and the frame 150 to protect other components of the display device 100, particularly, the plurality of flexible film 130 and the printed circuit board 140.

The cover shield 160 includes a plurality of first holes 161 to expose the plurality of panel magnets MG and the plurality of panel ferromagnetic substances MS.

Referring to FIG. 2, the plurality of first holes 161 are holes which expose the plurality of panel magnets MG and the plurality of panel ferromagnetic substances MS which are magnetic units fixed to the rear surface of the frame 150. The plurality of panel magnets MG and the plurality of panel ferromagnetic substances MS exposed through the plurality of first holes 161 may be in closer contact with the wall surface portion 200 and the intensity of the magnetic field line may be increased. If the plurality of panel magnets MG and the plurality of panel ferromagnetic substances MS are covered with the cover shield 160, the cover shield 160 may weaken the intensity of the magnetic field line by increasing intervals between the wall surface portion 200 and the plurality of panel magnets MG and the plurality of panel ferromagnetic substances MS and the display device 100 may be detached from the wall surface portion 200. Thus, the plurality of first holes 161 are disposed so that the plurality of panel magnets MG and the plurality of panel ferromagnetic substances MS are disposed adjacent to the wall surface portion 200 to firmly attach the display device 100 to the wall surface portion 200.

Meanwhile, the cover shield 160 may include a plurality of second holes for heat dissipation. The plurality of second holes may be disposed to overlap with at least the flexible films 130 and the printed circuit board 140. By disposing the plurality of second holes to overlap with at least the flexible film 130 and the printed circuit board 140 which extremely generate heat, the heat generated in the display device 100 may be effectively dissipated.

A heat dissipation fan 170 may be disposed on the rear surface of the display panel 120. The heat dissipation fan 170 may circulate the air between the cover shield 160 and the display panel 120 to dissipate the heat generated during driving of the display device 100. The heat of the display device 100 may be dissipated by convecting the air in the display device 100 by using the heat dissipation fan 170. In this case, the air may be introduced or discharged through the heat dissipation fan 170 and the plurality of second holes of the cover shield 160. On the other hand, in FIG. 2, it has been illustrated that four heat dissipation fans 170 are disposed, but the heat dissipation fans 170 may be omitted according to a design, and the number and arrangement of the heat dissipation fans 170 are not limited thereto.

The protective plate 110 is disposed to cover the front surface of the display panel 120. The protective plate 110 is disposed to cover the display panel 120 to protect the display panel 120 from an external impact, moisture, heat, or the like. The protective plate 110 may be made of a material having impact resistance and light transmittance. For example, the protective plate 110 may be a substrate made of glass, or a thin film made of a plastic material such as polycarbonate (PC), polyimide (PI), polymethylmethacrylate (PMMA), and polyethylene terephthalate (PET), but is not limited thereto.

Referring to FIG. 2, the connecting module 180 is disposed on the rear surface of the display panel 120. The connecting module 180 may include a connecting plate 181, a pressing portion 182, a protrusion 183, a receiving portion 184, and an elastic portion 185.

The connecting module 180 includes the connecting plate 181 for supplying power to the display panel 120 through the printed circuit board 140. The connecting plate 181 is configured to protrude outside the frame 150 or positioned more inward than the rear surface of the frame 150, depending on the detachment from the panel ferromagnetic substance MS of the connecting module 180. The connecting plate 181 may be made of a metal material having elasticity but is not limited thereto. The detailed description thereof will be described below with reference to FIGS. 6A to 6F.

The pressing portion 182 is configured to be detachable from the panel ferromagnetic substance MS. Specifically, the pressing portion 182 may be detached from the panel ferromagnetic substance MS to press the connecting plate 181 by the elastic portion 185 when an external magnetic force is applied to the panel ferromagnetic substance MS and the panel magnetic MG. Further, the pressing portion 182 may be attached to the panel ferromagnetic substance MS by the magnetic force of the panel ferromagnetic substance MS and the panel magnet MG when the external magnetic force is not applied to the panel ferromagnetic substance MS and the panel magnet MG.

An upper end of the pressing portion 182 in contact with the connecting plate 181 may be formed in a curved surface as illustrated in FIG. 4 so as to smoothly press the connecting plate 181 and suppress the connecting plate 181 from being damaged, but it is not limited thereto.

The pressing portion 182 may include a base portion 182B and a column portion 182C. The base portion 182B and the column portion 182C may be integrally formed but are not limited thereto.

The base portion 182B is a portion which is disposed at a lower end of the pressing portion 182 and substantially detachable from the panel ferromagnetic substance MS. Thus, the base portion 182B may have a flat bottom so as to be smoothly detachable from the panel ferromagnetic substance MS. The base portion 182B may have a disk shape as illustrated in FIG. 4 but is not limited thereto.

The column portion 182C may have a shape extending toward the upper end of the pressing portion 182 from the base portion 182B and may have a diameter smaller than the base portion 182B.

The protrusion 183 protrudes from a side portion of the pressing portion 182. The protrusion 183 may be formed integrally with the pressing portion 182 but is not limited thereto. In FIG. 4, two protrusions 183 are illustrated, but only one protrusion 183 may be included, and the protrusion 183 may be variously changed in design, and it is not limited thereto.

The receiving portion 184 receives the pressing portion 182 and the connecting plate 181. That is, the receiving portion 184 has an inner space, and the pressing portion 182 and the connecting plate 181 may be disposed in the inner space of the receiving portion 184.

The receiving portion 184 has a bottom hole 184BH and a side hole 184SH. The receiving portion 184 may guide the movement of the pressing portion 182 inserted into the bottom hole 184BH, and the pressing portion 182 may not be detached from the receiving portion 184. Further, the receiving portion 184 may guide the movement of the protrusion 183 inserted into the side hole 184SH, and the protrusion 183 may not be detached from the receiving portion 184.

The bottom hole 184BH is a space which becomes a passage through which the pressing portion 182 is moved and inserted with the column portion 182C of the pressing portion 182. The diameter of the bottom hole 184BH is equal to or larger than the diameter of the column portion 182C, and smaller than the diameter of the base portion 182B. Specifically, the pressing portion 182 may move in the receiving portion 184 by detachment from the panel ferromagnetic substance MS. In this case, since the diameter of the column portion 182C is equal to or smaller than the diameter of the bottom hole 184BH, the column portion may be moved in the bottom hole 184BH. However, since the diameter of the base portion 182B is greater than the diameter of the bottom hole 184BH, the base portion 182B may not pass through the bottom hole 184BH. That is, the base portion 182B is locked to the bottom hole 184BH, and the pressing portion 182 may not be detached from the receiving portion 184. Further, the movement range of the pressing portion 182 may be limited by the base portion 182B.

The side hole 184SH for guiding the movement of the protrusion 183 is disposed on the side portion of the receiving portion 184. Therefore, the protrusion 183 is linearly moved in the side hole 184SH.

The elastic portion 185 is fixed to the protrusion 183 and the receiving portion 184 to provide elasticity so that the pressing portion 182 presses the connecting plate 181. The elastic portion 185 may be, for example, a spring, but is not limited thereto.

Referring to FIG. 5, the connecting module 180 may be connected to the printed circuit board 140 disposed on the rear surface of the display panel 120 to be electrically connected to the display panel 120. The printed circuit board 140 includes a hole for passing through the connecting plate 181. Meanwhile, the cover shield 160 disposed to cover the rear surface of the frame 150 also has an opening through which a portion of the connecting module 180 passes. Thus, the connecting plate 181 may protrude through the hole of the printed circuit board 140 and the opening of the cover shield 160 as illustrated in FIGS. 3 and 5. In addition, a part of the connecting plate 181 may be connected to the printed circuit board 140. Therefore, when the power is supplied to the connecting plate 181, the power may be supplied to the display panel 120 through the printed circuit board 140.

Hereinafter, the connecting module 180 of the display device 100 according to an exemplary aspect of the present disclosure will be described in more detail with reference to FIGS. 6A to 6F together.

FIGS. 6A to 6F are cross-sectional views for describing an operation of the connecting module of the display device according to an exemplary aspect of the present disclosure. A mounting jig MJ of FIGS. 6B to 6E is a configuration which applies a magnetic force from the outside of the display device 100 according to an exemplary aspect of the present disclosure and is detachable to the display device 100 to move the display device 100.

Referring to FIGS. 6A to 6F, the connecting module 180 includes the connecting plate 181 for supplying the power to the display panel 120. The connecting plate 181 is configured to protrude outside the frame 150 or positioned more inward than the rear surface of the frame 150, depending on the detachment from the panel ferromagnetic substance MS of the connecting module 180.

Figure 6A:
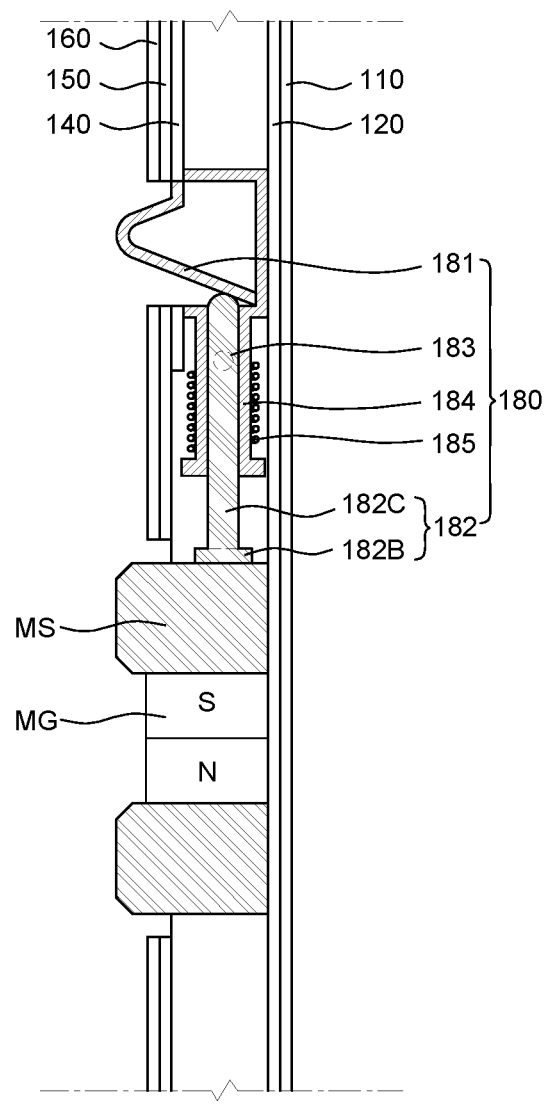
FIGS. 6A to 6F are cross-sectional views for describing an operation of the connecting module of the display device according to an exemplary aspect of the present disclosure.

Referring to FIG. 6A, the connecting plate 181 protrudes outside the frame 150 while the connecting module 180 is attached to the panel ferromagnetic substance MS. Specifically, the receiving portion 184 of the connecting module 180 may be fixed between the display panel 120 and the frame 150, in which the pressing portion 182 of the connecting module 180 may be attached by the magnetic force of the panel ferromagnetic substance MS and the panel magnet MG disposed on the rear surface of the display panel 120. As a result, since the connecting plate 181 is not pressed by the pressing portion 182, an original shape is maintained and the connecting plate 181 may protrude outside the frame 150.

Figure 6B:
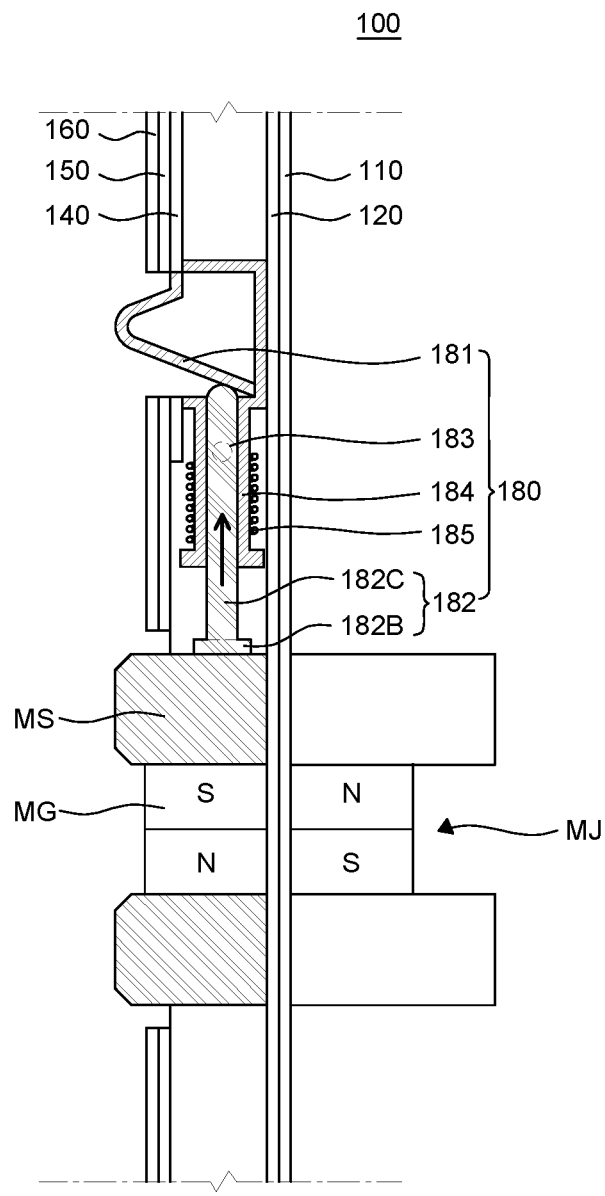

Referring to FIG. 6B, the mounting jig MJ is disposed on the front surface of the display panel 120. The mounting jig MJ may include a magnet and a ferromagnetic substance corresponding to the panel magnet MG and the panel ferromagnetic substance MS. When the user wants to move the display device 100 by using the mounting jig MJ, the user may use a state in which the magnet and the ferromagnetic substance of the mounting jig MJ and the panel magnet MG and the panel ferromagnetic substance MS are fixed by the magnetic force. As described above, when a strong magnetic force occurs between the magnet and the ferromagnetic substance of the mounting jig MJ and the panel magnet MG and the panel ferromagnetic substance MS, the magnetic force between the panel ferromagnetic substance MS and the panel magnet MG and the pressing portion 182 is weakened. Thus, the pressing portion 182 may be moved in an arrow direction of FIG. 6B by the elasticity of the elastic portion 185.

Figure 6C:
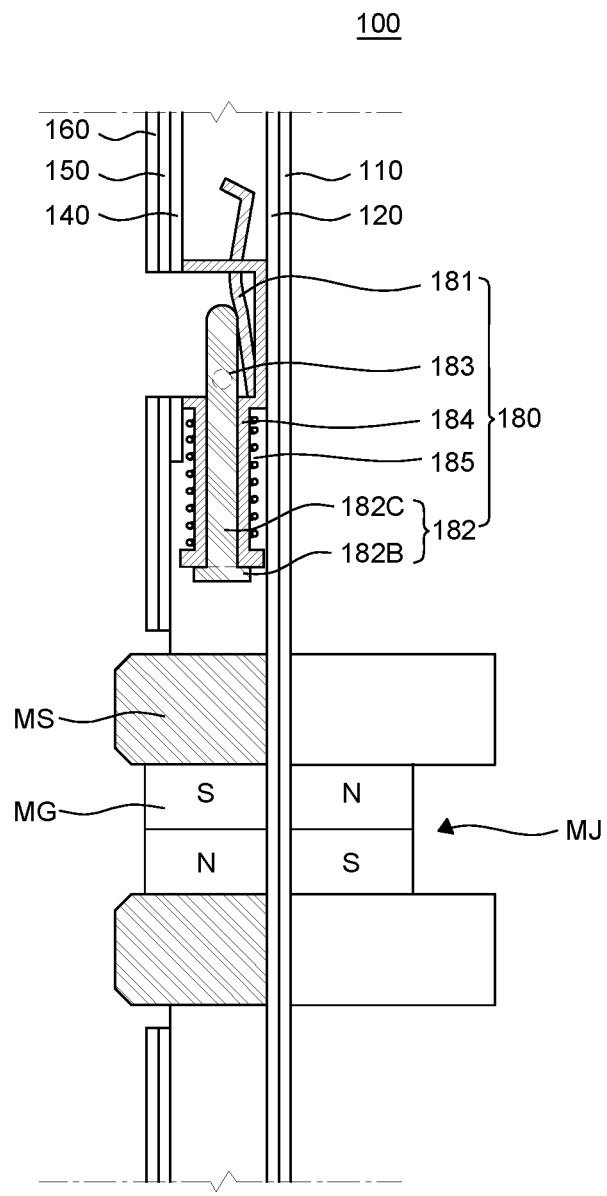

Referring to FIG. 6C, the pressing portion 182 is detached from the panel ferromagnetic substance MS by the magnetic force applied from the mounting jig MJ. At this time, the elastic portion 185, which has been compressed by the protrusion 183, is elastically restored as the pressing portion 182 is detached from the panel ferromagnetic substance MS to push the protrusion 183 in an upper direction. Thus, the pressing portion 182 presses the connecting plate 181 to modify the connecting plate 181 to be positioned more inward than the rear surface of the frame 150.

Figure 6D:
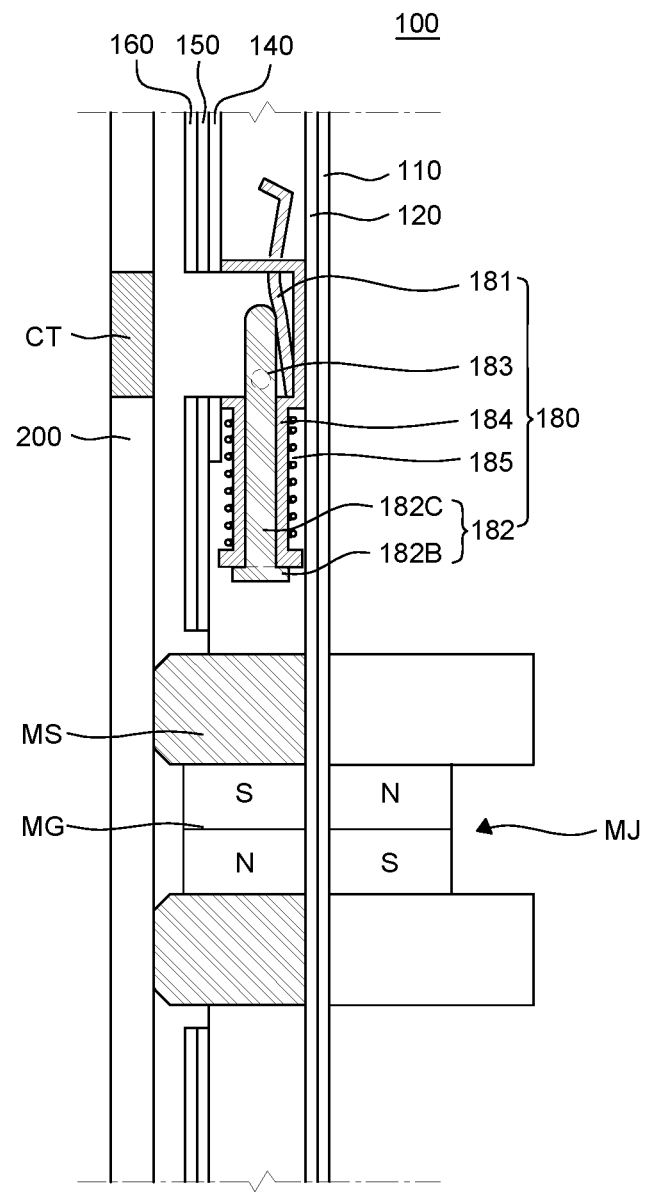

Referring to FIG. 6D, the user may grip the mounting jig MJ attached to the front surface of the display panel 120 to easily convey the display device 100 to the wall surface portion 200 for tiling. At this time, the user may move the mounting jig MJ to align the display device 100 so that the connecting plate 181 is positioned in correspondence with a connector CT of the wall surface portion 200.

Figure 6E:
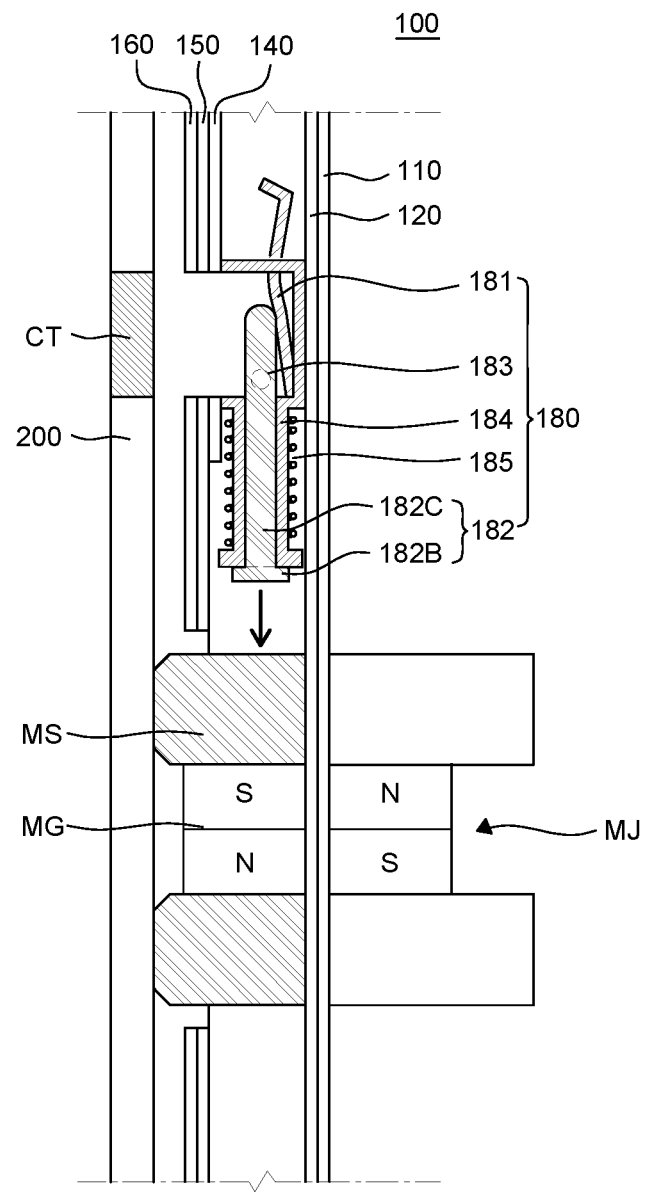

Referring to FIG. 6E, the display device 100 disposed on the regular position of the wall surface portion 200 may be seated in the wall surface portion 200. At this time, when the mounting jig MJ is removed from the front surface of the display panel 120, the magnetic force caused by the magnet and the ferromagnetic substance of the mounting jig MJ is removed, so that a magnetic force may occur between the panel ferromagnetic substance MS and the panel magnet MG and the pressing portion 182. Thus, the pressing portion 182 may be moved in the arrow direction of FIG. 6E by the magnetic force of the panel ferromagnetic substance MS and the panel magnet MG.

Figure 6F:
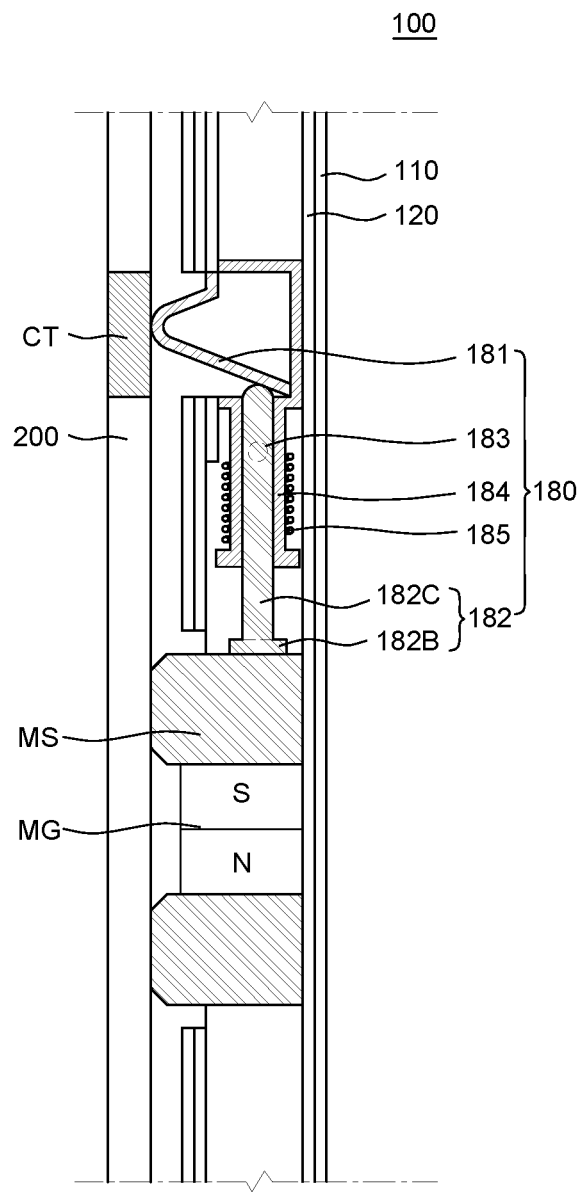

Referring to FIG. 6F, the pressing portion 182 is attached to the panel ferromagnetic substance MS by the magnetic force between the panel ferromagnetic substance MS and the panel magnet MG and the pressing portion 182. As a result, the connecting plate 181 may restore the shape modified by the pressing portion 182 and may protrude outside the frame 150. At this time, the connecting plate 181 is connected to the connector of the wall surface portion 200 disposed to correspond to the position of the connecting plate 181, and the connecting plate 181 may supply the power received from the connector to the display panel 120 through the printed circuit board 140.

In a general tiling display device, an apparatus for fixing to rear surfaces of a plurality of display devices is disposed, and the corresponding apparatus is implemented to be fastened to a wall surface portion. However, in the process of using the apparatus disposed on the rear surface of the display device, an operator is located behind the wall surface portion to perform the fastening process, and as a result, there is a problem that a space in which the operator may work is necessarily ensured behind the wall surface portion. Further, when maintenance for a specific display device among the plurality of display devices is required, there is inconvenience that the operator needs to separate the apparatus and the wall surface portion one by one by moving to the wall surface portion. Further, there is inconvenience that the operator needs to fasten or separate not only the corresponding display device but also the display devices adjacent to the corresponding display device in order to separate one display device.

Further, during the tiling of the display devices, the cables and connectors complicatedly disposed on the rear surface of the display devices may interfere with each other and a catching phenomenon may occur. As a result, there is a problem that a short-circuit occurs in the display device.

Thus, in the display device 100 according to an exemplary aspect of the present disclosure, the connecting plate 181 is configured to protrude outside the frame 150 or positioned more inward than the rear surface of the frame 150, depending on the detachment from the panel ferromagnetic substance MS of the connecting module 180. Accordingly, it is possible to control the power connecting of the display device 100 on the front surface of the display device 100 without using complicated lines to tile the display device 100. Specifically, when the mounting jig MJ is attached to the front surface of the display device 100, the pressing portion 182 is detached from the panel ferromagnetic substance MS to press the connecting plate 181. The connecting plate 181 is modified to be positioned more inward than the rear surface of the frame 150 so that the display device 100 may be easily separated and moved. The user may grip the mounting jig MJ on the front surface of the display panel 120 to move the display device 100 to the wall surface portion 200 of the tiling display device 1000. When the mounting jig MJ is separated from the display device 100 in contact with the wall surface portion 200, the pressing portion 182 is attached to the panel ferromagnetic substance MS and does not press the connecting plate 181. Accordingly, the connecting plate 181 may be restored to an original form to protrude outside the frame 150. The connecting plate 181 protruding outside the frame 150 is connected to the connector of the wall surface portion 200 to supply power to the display panel 120. That is, the user may control the connecting of the rear surface of the display device 100 on the front surface of the display device 100 by attaching the mounting jig MJ to the front surface of the display panel 120. Therefore, in the display device 100 according to an exemplary aspect of the present disclosure, the connecting plate 181 is configured to protrude outside the frame 150 or positioned more inward than the rear surface of the frame 150, depending on the detachment from the panel ferromagnetic substances MS of the connecting module 180. It is possible to control the connecting of the rear surface of the display device 100 on the front surface of the display device 100 without using the complicated lines for tiling the display device 100 and minimize the catching phenomenon or short-circuit occurrence in the process of connecting the complicated lines.

The exemplary aspects of the present disclosure can also be described as follows:

According to an aspect of the present disclosure, the display device includes: a display panel, a frame disposed on a rear surface of the display panel, a plurality of panel magnets disposed in the frame, a plurality of panel ferromagnetic substances disposed on both side surfaces of each of the plurality of magnets, and a connecting module disposed on the rear surface of the display panel and having a connecting plate for supplying power to the display panel, in which the connecting plate is configured to protrude outside the frame or be positioned more inward than the rear surface of the frame depending on the detachment from the panel ferromagnetic substances of the connecting module.

The connecting module may further include a pressing portion which is configured to be detachable from the panel ferromagnetic substance to press the connecting plate. The connecting plate may protrude outside the frame when the pressing portion is attached to the panel ferromagnetic substance and may be positioned more inward than the rear surface of the frame when the pressing portion is detached from the panel ferromagnetic substance.

The pressing portion may be detached from the panel ferromagnetic substance by a magnetic force applied from the outside and may be attached to the panel ferromagnetic substance when the magnetic force applied from the outside is removed.

The connecting module may further include a protrusion protruding from a side portion of the pressing portion, a receiving portion receiving the pressing portion and the connecting plate, and an elastic portion providing elasticity to the pressing portion.

The pressing portion may include a base portion and a column portion having a diameter smaller than the base portion, the receiving portion includes a bottom hole into which the column portion is inserted, and a diameter of the bottom hole is larger than or equal to a diameter of the column portion, and smaller than a diameter of the base portion.

The receiving portion may include a side hole to guide a movement of the protrusion. The protrusion may be linearly moved in the side hole.

The elastic portion may be fixed to the protrusion and the receiving portion to provide elasticity so that the pressing portion presses the connecting plate.

The display device may further comprise, a printed circuit board which is electrically connected to the display panel to be disposed on the rear surface of the display panel and includes a hole through which the connecting plate passes. The pressing portion may be disposed between the printed circuit board and the display panel, and the connecting plate supplies power to the printed circuit board.

The display device may further comprise a cover shield which is disposed to cover the rear surface of the frame and has an opening through which a part of the connecting module passes.

According to another aspect of the present disclosure, the display device includes: a display panel, a connecting module disposed on a rear surface of the display panel and having a connecting plate for supplying power to the display panel, and a frame which supports the display panel on the rear surface of the display panel and is disposed with a plurality of panel magnets and a plurality of panel ferromagnetic substances, in which the connecting plate is configured to be protrude outside the frame or positioned more inward than the rear surface of the frame depending on the detachment from the panel ferromagnetic substances of the connecting module.

The connecting plate may be modified so as to be positioned more inward than the rear surface of the frame by a magnetic force applied from the outside and may protrude outside the frame when the magnetic force applied from the outside is removed.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a display panel;
   a frame disposed on a rear surface of the display panel;
   a plurality of panel magnets disposed in the frame;
   a plurality of panel ferromagnetic substances disposed on both side surfaces of each of the plurality of magnets; and
   a connecting module disposed on the rear surface of the display panel and having a connecting plate for supplying power to the display panel,
   wherein the connecting plate protrudes outside the frame or is positioned more inwardly than a rear surface of the frame depending on detachment from the plurality of panel ferromagnetic substances of the connecting module.

2. The display device of claim 1, wherein the connecting module further includes a pressing portion configured to be detachable from the plurality of panel ferromagnetic substances to press the connecting plate, and
   wherein the connecting plate protrudes outside the frame when the pressing portion is attached to the panel ferromagnetic substance and is positioned more inward than the rear surface of the frame when the pressing portion is detached from the plurality of panel ferromagnetic substances.

3. The display device of claim 2, wherein the pressing portion is detached from the plurality of panel ferromagnetic substances by a magnetic force applied from outside and attached to the plurality of panel ferromagnetic substances when the magnetic force applied from the outside is removed.

4. The display device of claim 2, wherein the connecting module further includes:
   a protrusion protruding from a side portion of the pressing portion;
   a receiving portion receiving the pressing portion and the connecting plate; and
   an elastic portion providing elasticity to the pressing portion.

5. The display device of claim 4, wherein the pressing portion includes a base portion and a column portion having a diameter smaller than the base portion, and the receiving portion includes a bottom hole into which the column portion is inserted.

6. The display device of claim 5, wherein the bottom hole has a diameter larger than or equal to a diameter of the column portion, and smaller than a diameter of the base portion.

7. The display device of claim 4, wherein the receiving portion includes a side hole to guide a movement of the protrusion, and the protrusion is linearly moved in the side hole.

8. The display device of claim 4, wherein the elastic portion is fixed to the protrusion and the receiving portion to provide elasticity so that the pressing portion presses the connecting plate.

9. The display device of claim 2, further comprising a printed circuit board which is electrically connected to the display panel to be disposed on the rear surface of the display panel and includes a hole through which the connecting plate passes.

10. The display device of claim 9, wherein the pressing portion is disposed between the printed circuit board and the display panel, and the connecting plate supplies power to the printed circuit board.

11. The display device of claim 1, further comprising a cover shield which is disposed to cover the rear surface of the frame and has an opening through which a part of the connecting module passes.

12. A display device comprising:
    a display panel;
    a connecting module disposed on a rear surface of the display panel and having a connecting plate for supplying power to the display panel; and
    a frame which supports the display panel on the rear surface of the display panel and is disposed with a plurality of panel magnets and a plurality of panel ferromagnetic substances,
    wherein the connecting plate is positioned outside the frame or more inward than a rear surface of the frame depending on detachment from a plurality of panel ferromagnetic substances of the connecting module.

13. The display device of claim 12, wherein the connecting plate is modified so as to be positioned more inward than the rear surface of the frame by a magnetic force applied from the outside and protrudes outside the frame when the magnetic force applied from the outside is removed.

14. A display device comprising:
    a display panel;
    a frame disposed on a rear surface of the display panel;
    a plurality of panel magnets disposed in the frame;
    a plurality of panel ferromagnetic substances disposed on both side surfaces of each of the plurality of magnets;
    a printed circuit board electrically connected to the display panel; and
    a connecting module including a connecting plate for supplying power to the display panel and a pressing portion configured to be detachable from a plurality of panel ferromagnetic substances to press the connecting plate,
    wherein the connecting plate protrudes outside the frame when the pressing portion is attached to the plurality of panel ferromagnetic substances and is positioned more inwardly than the rear surface of the frame when the pressing portion is detached from the plurality of panel ferromagnetic substances, and
    wherein the pressing portion is detached from the plurality of panel ferromagnetic substances by a magnetic force applied from outside and attached to the plurality of panel ferromagnetic substances when the magnetic force applied from the outside is removed.

15. The display device of claim 14, wherein the connecting module further includes:
    a protrusion protruding from a side portion of the pressing portion;
    a receiving portion receiving the pressing portion and the connecting plate; and
    an elastic portion providing elasticity to the pressing portion.

16. The display device of claim 15, wherein the pressing portion includes a base portion and a column portion having a diameter smaller than the base portion, and the receiving portion includes a bottom hole into which the column portion is inserted.

17. The display device of claim 15, wherein the receiving portion includes a side hole to guide a movement of the protrusion, and the protrusion is linearly moved in the side hole.

18. The display device of claim 15, wherein the elastic portion is fixed to the protrusion and the receiving portion to provide elasticity so that the pressing portion presses the connecting plate.

19. The display device of claim 14, wherein the printed circuit includes a hole through which the connecting plate passes.

20. The display device of claim 19, wherein the pressing portion is disposed between the printed circuit board and the display panel, and the connecting plate supplies power to the printed circuit board.

* * * * *